US006971056B1

(12) United States Patent
Classon et al.

(10) Patent No.: US 6,971,056 B1
(45) Date of Patent: Nov. 29, 2005

(54) DECODER-USABLE SYNDROME GENERATION WITH REPRESENTATION GENERATED WITH INFORMATION BASED ON VECTOR PORTION

(75) Inventors: Brian Keith Classon, Streamwood, IL (US); Vipul Anil Desai, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/524,172

(22) Filed: Mar. 13, 2000

(51) Int. Cl.[7] .............................................. H03M 13/15
(52) U.S. Cl. ....................................... 714/782; 714/785
(58) Field of Search ................................ 714/784, 785, 714/782

(56) References Cited

U.S. PATENT DOCUMENTS

| 4,037,093 | A | | 7/1977 | Gregg ........................... 235/164 |
| 4,410,989 | A | | 10/1983 | Berlekamp ..................... 371/40 |
| 4,763,330 | A | * | 8/1988 | Shimizu ......................... 714/785 |
| 4,856,004 | A | * | 8/1989 | Foster et al. ................... 714/759 |
| 4,958,349 | A | * | 9/1990 | Tanner et al. .................. 714/759 |
| 5,272,661 | A | * | 12/1993 | Raghavan et al. ............. 708/492 |
| 5,471,485 | A | * | 11/1995 | Tong ............................. 714/757 |
| 5,596,589 | A | * | 1/1997 | Thomsen et al. .............. 714/759 |
| 5,715,262 | A | * | 2/1998 | Gupta ............................ 714/784 |
| 5,768,296 | A | * | 6/1998 | Langer et al. ................. 714/784 |
| 5,771,244 | A | * | 6/1998 | Reed et al. .................... 714/752 |
| 6,219,815 | B1 | * | 4/2001 | DesJardins et al. ........... 714/781 |
| 6,260,173 | B1 | * | 7/2001 | Weng et al. ................... 714/781 |
| 6,327,690 | B1 | * | 12/2001 | Zhang et al. .................. 714/769 |
| 6,343,305 | B1 | * | 1/2002 | Ko.cedilla. et al. ............ 708/492 |
| 6,378,104 | B1 | * | 4/2002 | Okita ............................. 714/784 |

OTHER PUBLICATIONS

S. Lin and D. Costello; "*Error Control Coding: Fundamentals and Applications*", Englewood Cliffs, New Jersey, Prentice Hall, 1983.
Shyue-Win Wei, *Member, IEEE,* and Che-Ho-Wei, *Senior Member, IEEE; A High-Speed Real-Time Binary BCH Decoder; IEEE Transactions on Circuits and Systems for Video Technology,* vol. 3, No. 2, Apr. 1993; pp. 138-147.
Jonathan Hong and Martin Vetterli, *Senior Member, IEEE;* "*Simple Algorithms for BCH Decoding*"; IEEE Transaction on Communications, vol. 43, No. 8, Aug. 1995; pp. 2324-2333.
Elwyn R. Berlekamp, *Fellow, IEEE; Bit-Serial Reed-Solomon Encoders;* IEEE Transactions on Information THEORY, vol. IT-28, No. 6, Nov. 1982; pp. 869-874.

* cited by examiner

Primary Examiner—Stephen M. Baker

(57) ABSTRACT

System (100) for generating syndrome (222) usable in decoder (130) includes reducer (340) and converter (330). Reducer (340) employs information to generate representation (342). Converter (330) generates, with employment of representation (342), syndrome (222).

33 Claims, 6 Drawing Sheets

DECODER-USABLE SYNDROME GENERATION WITH REPRESENTATION GENERATED WITH INFORMATION BASED ON VECTOR PORTION

FIELD OF THE INVENTION

The present invention relates generally to decoders and more particularly to a syndrome usable in a decoder.

BACKGROUND OF THE INVENTION

As will be understood by those skilled in the art, a syndrome comprises a basic element of a decoding procedure. In one example, the syndrome can be used to identify the bits in error.

One example of a decoder comprises a Bose, Chaudhuri, and Hocquenghem ("BCH") decoder. A BCH decoder operates with BCH codes. BCH codes constitute a broad class of error-correcting and error-detecting codes. BCH codes are typically designed using the theory developed for Galois field ("GF") arithmetic. Examples of BCH codes include binary BCH codes and Reed-Solomon codes. Hamming codes, for example, comprise a subset of binary BCH codes. BCH codes comprise a subset of cyclic codes, as will be understood by those skilled in the art.

A binary BCH code, in one example, is characterized by a block length N, an information vector length K, a number of bits per symbol m where $N=2^m-1$, a primitive element $\alpha$ used to construct a Galois field $GF(2^m)$, a generator polynomial $g(x)$, and a guaranteed error correction capability t. Commonly, those skilled in the art interchangeably employ the terms "vector" and "polynomial." For example, the K-bit information vector $u[0], \ldots, u[K-1]$ is represented as the polynomial $u(x)=u[K-1]x^{K-1}+u[K-2]x^{K-2}+\ldots+u[1]x+u[0]$, where the coefficients $u[0], \ldots,$ and $u[K-1]$ are elements of $GF(2^m)$, and are binary in the case of binary BCH codes.

A detailed example is now presented for explanatory purposes. A K-bit information vector $u(x)$ is encoded into an N-bit codeword $v(x)$ by polynomial multiplication with $g(x)$. In one example, the encoder is initialized to some value, such as zero, before the polynomial multiplication. This codeword is transmitted, possibly corrupted by the channel, and received as a vector $r(x)$. A BCH decoder estimates a decoded information vector $w(x)$ based on $r(x)$ and possibly additional information.

Several decoder techniques have been developed to estimate $w(x)$ from $r(x)$. In one example of a BCH decoder, syndromes are computed by evaluating the received vector $r(x)$ at consecutive roots of the generator polynomial $g(x)$. The syndromes characterize the difference from the received vector to the nearest codeword. So, the syndromes can be used in a decoder to correct this difference.

The properties of a generator polynomial, in one example, can suggest a design of a BCH decoder. One can assume, for example, that the necessary roots of the generator polynomial comprise at least 2t consecutive values $\alpha^{L+1}$, $\alpha^{L+2}, \ldots, \alpha^{L+2t}$, where $\alpha$ represents the primitive element used to construct the Galois field $GF(2^m)$, and L represents a starting power of the roots. In one example, when the roots comprise $\alpha^1, \alpha^2, \ldots, \alpha^{2t}$ (L=0), it is understood by those skilled in the art that the syndromes $s_j$ for binary BCH codes possess a property as described by the following exemplary Equation (1).

$$s_{2j}=(s_j)^2, j=1, \ldots, t \tag{1}$$

Because of Equation (1), in one example, the odd-numbered syndromes can be first computed by evaluating the received vector $r(x)$ at the necessary odd-powered roots of the generator polynomial. The even-numbered syndromes can then be computed by using Equation (1). In this example, the number of operations in a BCH decoder can be reduced.

In another example, when the necessary roots of the generator polynomial are consecutive, the first root and error-correcting capability t comprise sufficient information to determine the subsequent roots of the generator polynomial. In this example, a BCH decoder can reduce the amount of information (e.g., memory usage) needed.

Computing syndromes typically comprises a computationally-intensive task because the computation typically involves polynomial evaluation using Galois field arithmetic. To compute syndrome $s_j$ directly, the received vector $r(x)$ is evaluated at root $\alpha^{j+L}$, as follows in exemplary Equation (2).

$$s_j=r(\alpha^{j+L})=r_{N-1}(\alpha^{j+L})^{N-1}+r_{N-2}(\alpha^{j+L})^{N-2}+\ldots+r_1(\alpha^{j+L})+r_0 \tag{2}$$

Evaluating Equation (2), in one example, requires N−1 $GF(2^m)$ additions, N−1 general $GF(2^m)$ multiplications, and N−1 general $GF(2^m)$ exponentiations per syndrome.

When representing the Galois field elements as an m-tuple over a standard canonical basis $(\alpha^{m-1}, \ldots, \alpha, 1)$, $GF(2^m)$ addition is equivalent to a simple exclusive-OR operation. Further, $GF(2)$ multiplication is equivalent to a logical AND operation for m=1. However, the general $GF(2^m)$ multiplications and general $GF(2^m)$ exponentiations typically have no simple implementation for m>1 in the standard canonical basis. To minimize the number of these exponentiations, one technique for evaluation of polynomials employs an iterative algorithm, such as Horner's rule. For instance, Equation (2) can be expressed as follows in exemplary Equation (3).

$$s_j=r(\alpha^{j+L})=r(\beta)=(\ldots((r_{N-1}\beta+r_{N-2})\beta+r_{N-3})\beta+\ldots+r_1)\beta+r_0 \text{ where } \beta=\alpha^{j+L} \tag{3}$$

On the one hand, Equation (3) eliminates the general $GF(2^m)$ exponentiations. On the other hand, Equation (3) nevertheless as a shortcoming requires N−1 general $GF(2^m)$ multiplications per syndrome.

To address the shortcoming of requiring $GF(2^m)$ multiplications in syndrome calculation, a number of hardware and software approaches have been offered. For example, certain hardware designs implement a general $GF(2^m)$ multiplier. One shortcoming of a typical hardware implementation of a general $GF(2^m)$ multiplier is the relatively large amount of power consumption required by the general $GF(2^m)$ multiplier.

Further, a number of software implementation that use lookup tables have been offered to perform general $GF(2^m)$ multiplication for syndrome calculations. In one example, the multiplicands are transformed from the standard canonical basis into an exponential representation by using lookup tables. In the exponential representation, integer arithmetic (i.e., addition, modulo) replaces $GF(2^m)$ multiplication. Once the integer result has been computed, a lookup table is used to transform the integer result into the standard canonical basis. For instance, if a and b are elements of $GF(2^m)$, the steps of a general $GF(2^m)$ multiplier in one software implementation for computing $c=a\times b$ are as follows.

if ((a==0)or(b==0))
  c=0
else
  a'=LUT(a)
  b'=LUT(b)

$c' = (a' + b') \bmod (2^m - 1)$ $c = LUT^{-1}(c')$

In the above steps, LUT is the lookup table used to transform a number from the standard canonical basis into an exponential representation, and $LUT^{-1}$ is the lookup table that transforms an exponential representation into the standard canonical basis.

This exemplary software implementation suffers from the use of lookup tables. As one shortcoming, the memory requirement of the lookup tables is proportional to $2^m$. For modest m, such as m=9, the memory requirement therefore undesirably exceeds 512 words. As another shortcoming, the required accessing of the lookup tables limits the processing capabilities of the software implementation. This use of the lookup table undesirably lowers the data rate that is sustainable for a software implementation.

Thus, a need exists for enhanced generation of a syndrome that is usable in a decoder.

DETAILED DESCRIPTION OF THE INVENTION

A detailed discussion of an exemplary embodiment of the invention is presented herein, for illustrative purposes.

Figure 1:
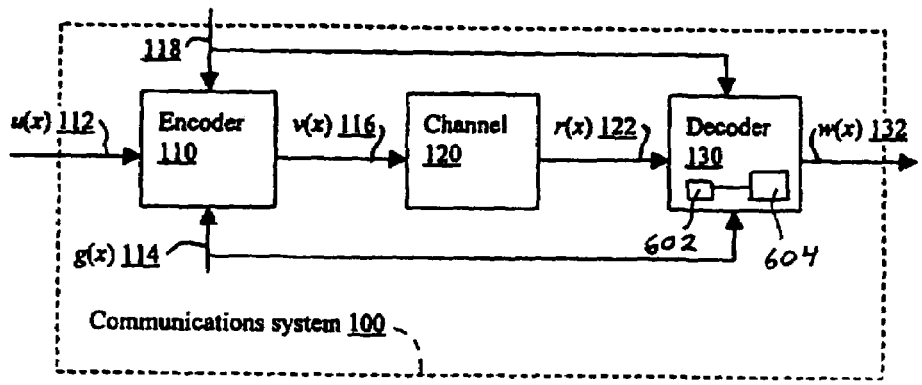
FIG. 1 is a functional block diagram of one example of a communications system that encodes and decodes a vector.

FIG. 1 illustrates a functional block diagram of one example of a communications system 100. System 100, in one example, includes a plurality of components such as computer software and/or hardware components. For instance, a number of such components can be combined or divided, as will be appreciated by those skilled in the art.

Referring still to FIG. 1, in one example of system 100, an encoder 110 is initialized with an initialization 118. The encoder 110, for instance, multiplies an information vector u(x) 112 by a generator polynomial g(x) 114 to produce a codeword vector v(x) 116. In one example, the necessary roots of the generator polynomial g(x) 114 comprise at least 2t consecutive values. For example, t comprises a guaranteed error correction capability of a binary Bose, Chaudhuri, and Hocquenghem ("BCH") code. The codeword vector v(x) 116 is transmitted through a channel 120. In one example, the channel 120 possibly corrupts the codeword vector v(x) 116. The output of the channel 120 is a received vector r(x) 122. A decoder 130 processes the received vector r(x) 122 by using the generator polynomial g(x) 114 to produce a decoded vector w(x) 132. The decoded vector w(x) 132 comprises an estimate of the information vector u(x) 112 by the decoder 130. One example of decoder 130 comprises (e.g., computer) processor 602 coupled with memory 604. Memory 604, in one example, serves to store logic, for instance, a software implementation.

Figure 2:
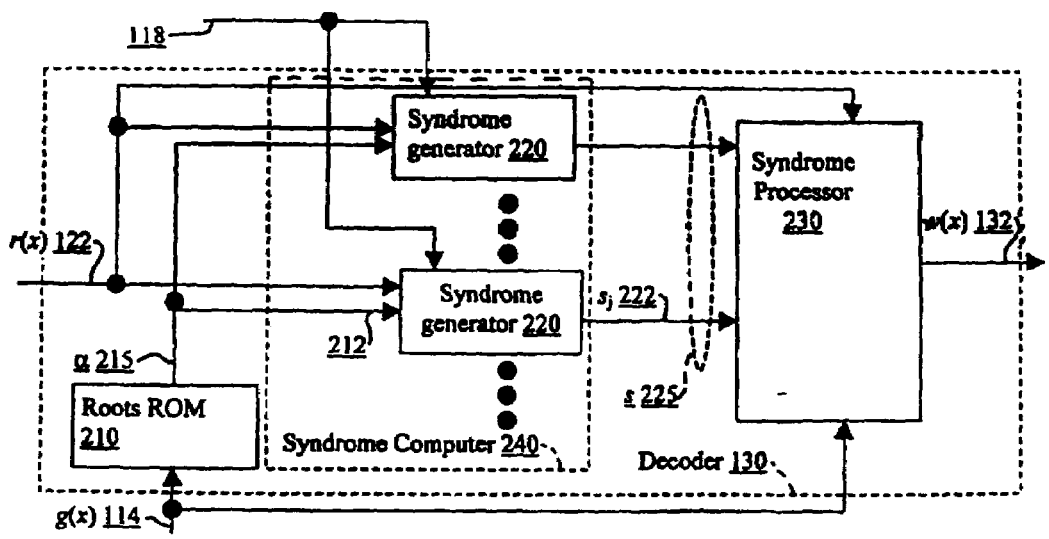
FIG. 2 is a functional block diagram that depicts exemplary details of a decoder component of the communications system of FIG. 1.

FIG. 2 illustrates exemplary details of the decoder 130 of the communications system 100 (FIG. 1). In one example, a roots ROM 210 comprises the necessary roots of the generator polynomial g(x) 114 and produces a roots array α 215. In one example, the necessary roots can be computed from the polynomial g(x) 114. In another example, the roots of the polynomial g(x) 114 can be precomputed by the decoder 130 and stored in the roots ROM 210. In a further example, the roots ROM 210 can comprise at least one root when the necessary roots are sequential. In such an example, the first root of the sequence and the guaranteed error correction capability are sufficient. In yet another example, the roots ROM 210 can comprise a particular subset of the necessary roots. In such an example with the starting power L=0, the odd-powered roots, such as α, $\alpha^3$, $\alpha^5$, etc., comprise the subset.

Again referring to FIG. 2, a syndrome computer 240 of decoder 130, in one example, comprises a plurality of syndrome generators 220 for processing the received vector r(x) 122 and the roots array α 215 to produce a plurality of syndromes s 225.

For instance, a $j^{th}$ instance of syndrome generator 220 processes a generator polynomial root 212, which corresponds to a $j^{th}$ element of the roots array α 215, and the received vector r(x) 122 to produce a $j^{th}$ instance of syndrome $s_j$ 222. For example, a syndrome processor 230 processes the plurality of syndromes s 225, the generator polynomial g(x) 114, and the received vector r(x) 122 to produce the decoded vector w(x) 132.

Further referring to FIG. 2, in one example, syndrome computer 240 comprises multiple parallel syndrome generators 220. In another example, syndrome computer 240 comprises a single syndrome generator 220. For instance, the single syndrome generator 220 can be employed with additional hardware (not shown), as will be understood by those skilled in the art.

Figure 3:
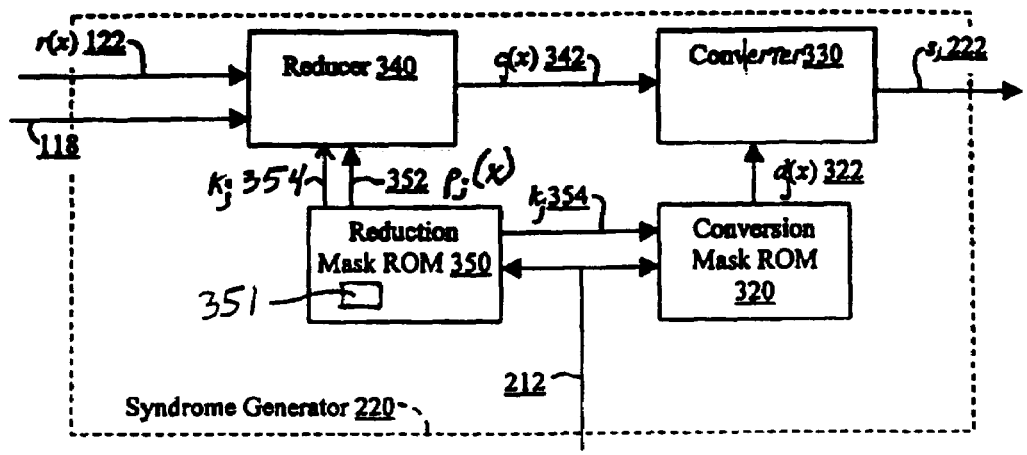
FIG. 3 is a functional block diagram that depicts illustrative details of one example of a syndrome generator component of the decoder component of FIG. 2.

FIG. 3 illustrates exemplary details of the syndrome generator 220 of the decoder 130 (FIGS. 1–2). In one example, a reducer 340 processes the received vector r(x) 122 using the initialization 118 and a minimal polynomial $p_j(x)$ 352 for producing a representation $c_j(x)$ 342. The minimal polynomial $p_j(x)$ 352 corresponds to the generator polynomial root 212. For instance, a reduction mask ROM 350 comprises the minimal polynomial $p_j(x)$ 352. In a further example, the reduction mask ROM 350 also comprises a minimal polynomial degree $k_j$ 354 corresponding to the minimal polynomial $p_j(x)$ 352. In one example, the minimal polynomial $p_j(x)$ 352 and the minimal polynomial degree $k_j$ 354 can be precomputed because the decoder 130 knows the generator polynomial g(x) 114 (FIGS. 1–2). A detailed discussion of an exemplary procedure for performing such a computation is presented herein. In one example, reduction mask ROM 350 comprises one or more reduction masks 351. For instance, syndrome generator 220 generates a reduction mask 351 from a generator polynomial root 212, and employs the reduction mask 351 to generate representation $c_j(x)$ 342.

Again referring to FIG. 3, a conversion mask ROM 320 of syndrome generator 220 comprises one or more instances of conversion mask $d_j(x)$ 322 corresponding to the generator polynomial root 212 and the minimal polynomial degree $k_j$ 354. For example, the one or more conversion masks $d_j(x)$ 322 can be precomputed because the decoder 130 (FIGS. 1–2) knows the generator polynomial g(x) 114 (FIGS. 1–2). In one example, a converter 330 employs (e.g., transforms) the representation $c_j(x)$ 342 using the one or more conversion masks $d_j(x)$ 322 to generate (e.g., produce) the syndrome $s_j$ 222.

Figure 4:
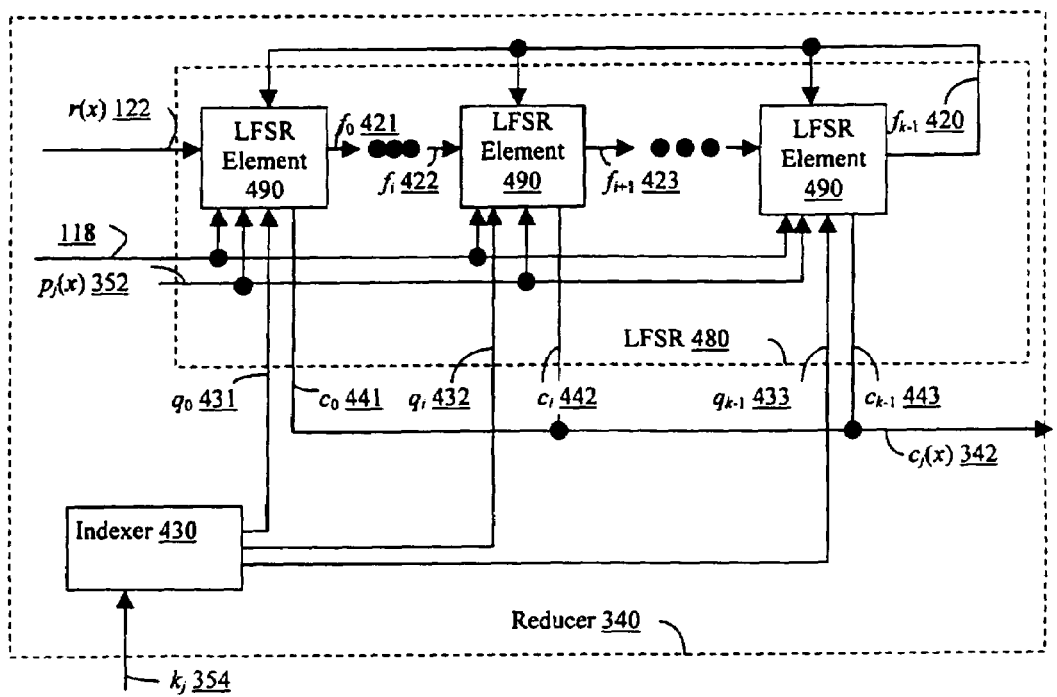
FIG. 4 is a functional block diagram of exemplary details of a reducer component of the syndrome generator component of FIG. 3.

FIG. 4 illustrates exemplary details of the reducer 340 of the syndrome generator 220 (FIGS. 2–3). In one example, the reducer 340 comprises a linear feedback shift register ("LFSR") 480 and an indexer 430. For example, the indexer 430 is responsive to the minimal polynomial degree $k_j$ 354 for producing an index $q_0$ 431 set to 0, an index $q_i$ 432 set to i-1, etc., and an index $q_{k-1}$ 433 set to $k_j$-1. The LFSR 480 comprises, for instance, a number of LFSR elements 490. The index $q_i$ 432, in one example, can control the inputs to the LFSR element 490. In one example, the number of LFSR elements 490, is determined by the minimal polynomial degree $k_j$ 354. LFSR elements 490 produce, for example, outputs $c_0$ 441, $c_i$ 442, etc., and $c_{k-1}$ 443 that comprise the representation $c_j(x)$ 342. In addition, LFSR elements 490 produce symbols $f_0$ 421, $f_i$ 422, $f_{i+1}$ 423, etc., and $f_{k-1}$ 420. In one example, $f_{k-1}$ 420 comprises a feedback symbol for recursion with respect to the LFSR elements 490.

Figure 5:
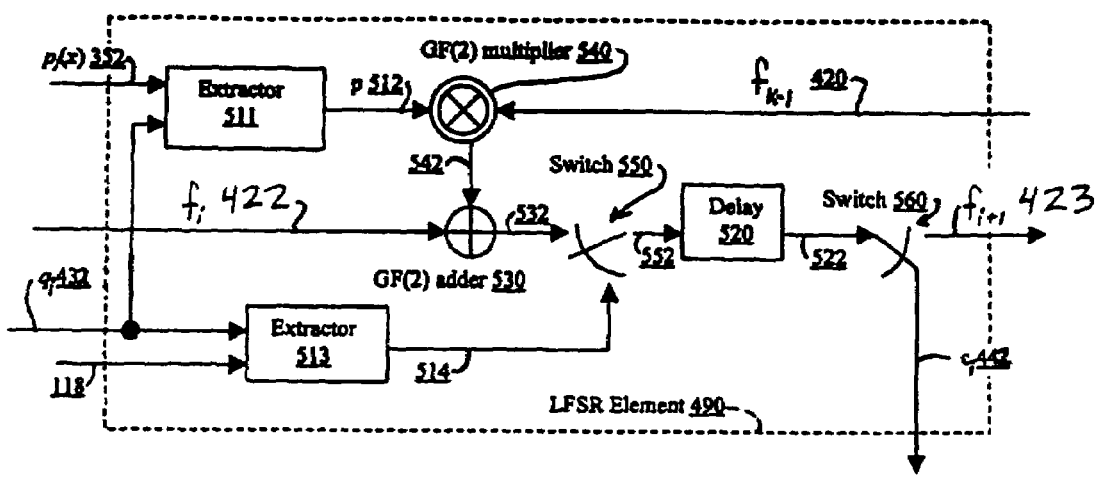
FIG. 5 is a functional block diagram of exemplary details of a linear feedback shift register element component of the reducer component of FIG. 4.

FIG. 5 illustrates exemplary details of an LFSR element 490 of the LFSR 480 (FIG. 4). For instance, a switch 550 selects an output 532, from a GF(2) adder 530, to produce a delay input 552. At reset, the switch 550 selects an extracted initialization 514. A delay 520 holds the delay input 552 from the switch 550, and produces a delay output 522. A switch 560 directs the delay output 522 to the symbol $f_{i+1}$ 423. The switch 560, after processing information (e.g., output 522) that is based on a portion of a received vector r(x) 122 (FIGS. 2–4), directs the delay output 522 to the output $c_i$ 442.

Further referring to FIG. 5, an extractor 513 of LFSR element 490, in one example, uses the index $q_i$ 432 to extract the corresponding element of initialization 118, for producing the extracted initialization 514. For instance, an extractor 511 uses the index $q_i$ 432 to extract the corresponding element of the minimal polynomial $p_j(x)$ 352, for producing a binary coefficient p 512. For example, a GF(2) multiplier 540 multiplies the binary coefficient p 512 and the feedback symbol $f_{k-1}$ 420 to produce a product symbol 542. The multiplier 540, in one example, operates over GF(2), so its operation advantageously reduces to a logical-AND operation. For instance, GF(2) adder 530 combines the symbol $f_i$ 422 and the product symbol 542, to produce the output 532.

Referring now to FIG. 3, an exemplary procedure for computing the minimal polynomial $p_j(x)$ 352 and its minimal polynomial degree $k_j$ 354 corresponding to the generator polynomial root 212, is discussed. One can assume, for example, that the necessary roots of the generator polynomial g(x) 114 (FIGS. 1–2) comprise the values $\alpha^{L+1}$, $\alpha^{L+2}$, ..., $\alpha^{L+2t}$. The assumption of consecutive roots is reasonable because most generator polynomials have consecutive roots. Although the starting power L can be set to an arbitrary value, L is often set to 0.

For instance, the minimal polynomial $p_j(x)$ 352 is computed by employing the following exemplary Equations 4–5.

$$p_j(X) = \prod_{i \in CC(j)} (x - \alpha^i) \quad (4)$$

$$CC(j) = \{(j \cdot 2^l) \bmod (2^m - 1), l = 0, 1, 2 \ldots, k_j - 1\} \quad (5)$$

In Equations 4–5, m is the number of bits per symbol, $\alpha$ is the primitive element used to construct the Galois field $GF(2^m)$, $k_j$ (the minimal polynomial degree $k_j$ 354) is the degree of the minimal polynomial $p_j(x)$ 352 with $k_j < m$, and CC(j) is a cyclotomic coset of $\alpha_j$.

In addition, the following illustrative Table 1 lists the minimal polynomial degrees $k_j$ 354 of a given generator polynomial root 212 and a given m for BCH codes of length $\leq 2^{13}-1$ that correct up to t=7 errors.

TABLE 1

Minimal polynomial degrees $k_j$ 354.

| M | $2^m - 1$ | $\alpha$ | $\alpha^3$ | $\alpha^5$ | $\alpha^7$ | $\alpha^9$ | $\alpha^{11}$ | $\alpha^{13}$ |
|---|---|---|---|---|---|---|---|---|
| 3 | 7 | 3 | 3 | $\alpha^3$ | N/A | N/A | N/A | N/A |
| 4 | 15 = 3 × 5 | 4 | 4 | 2 | 4 | $\alpha^3$ | $\alpha^7$ | $\alpha^7$ |
| 5 | 31 | 5 | 5 | 5 | 5 | $\alpha^5$ | 5 | $\alpha^{11}$ |
| 6 | 63 = 3 × 3 × 7 | 6 | 6 | 6 | 6 | 3 | 6 | 6 |
| 7 | 127 | 7 | 7 | 7 | 7 | 7 | 7 | 7 |
| 8 | 255 = 3 × 5 × 17 | 8 | 8 | 8 | 8 | 8 | 8 | 8 |
| 9 | 511 = 7 × 73 | 9 | 9 | 9 | 9 | 9 | 9 | 9 |
| 10 | 1023 = 3 × 11 × 31 | 10 | 10 | 10 | 10 | 10 | 10 | 10 |
| 11 | 2047 = 13 × 89 | 11 | 11 | 11 | 11 | 11 | 11 | 11 |
| 12 | 4095 = 3 × 3 × 5 × 7 × 13 | 12 | 12 | 12 | 12 | 12 | 12 | 12 |
| 13 | 8191 | 13 | 13 | 13 | 13 | 13 | 13 | 13 |

For a number of codes of interest, the minimal polynomial degree $k_j$ 354 equals m for all syndromes s 225 that need to be computed. If a polynomial root has the same minimal polynomial $p_j(x)$ 352 as another root, the other root is listed instead of the degree. Note that the underlined entries in Table 1 have k<m: $\alpha^5$ in $GF(2^4)$ and $\alpha^9$ in $GF(2^6)$. Also note that the degree of all but the two entries with k<m and of $\alpha^9$ in $GF(2^4)$, can be computed as follows.

1. m prime $\Rightarrow$ k=m
2. If j is the exponent of the element $\alpha_j$, when $\gcd(2^m-1, j)=1 \Rightarrow$ k=m ("gcd" represents the greatest common denominator operation).
3. If j is the exponent of the element $\alpha_j$, $m > 2\lfloor \log_2 j \rfloor \Rightarrow$ k=m where $$\lfloor x \rfloor = \begin{cases} x & x \text{ integer} \\ \text{int}(x+1) & \text{otherwise} \end{cases}$$

For the exceptions, a table of published minimal polynomials can be used, or the cyclotomic cosets can be computed using Equation (5).

In one example, use of minimal polynomial $p_j(x)$ 352 advantageously allows the general $GF(2^m)$ multiplier employed in previous designs, to be replaced by reducer 340 and the converter 330, as in FIG. 3. The reducer 340 desirably operates in a k-tuple basis with respect to $(\alpha^j)^{k-1}, \ldots, \alpha^j, 1$, whereas a general $GF(2^m)$ multiplier operates in the standard canonical basis $(\alpha^{m-1}, \ldots, \alpha, 1)$. The converter 330 advantageously transforms the k-tuple basis into the standard canonical basis. The k-tuple basis with respect to $(\alpha^j)^{k-1}, \ldots, \alpha^j, 1$ desirably avoids the previous need for the general $GF(2^m)$ multiplier, by advantageously transforming the syndrome evaluation of Equation (3) into the representation evaluation of the following exemplary Equation (6).

$$c_j = r(\alpha') = (\ldots ((r_{N-1}\alpha' + r_{N-2})\alpha' + r_{N-3})\alpha' + \ldots + r_1)\alpha' + r_0 \qquad (6)$$

In Equation (6), $\alpha'$ is a primitive element of $GF(2^k)$. Those skilled in the art will appreciate that evaluation of a polynomial by a primitive element (such as evaluation of $r(x)$ 122 by the primitive element $\alpha'$ in $GF(2^k)$) can be performed by an LFSR 480. In a typical example of LFSR 480, all operations involve binary operands; for example, multiplication of binary operands is equivalent to a logical-AND operation.

Now referring to FIG. 3, in one example, one or more instances of conversion mask $d_j(x)$ 322 of the conversion mask ROM 320, are computed from the generator polynomial root 212 and the minimal polynomial degree $k_j$ 354 such as by the following exemplary Equation (7).

$$d_i = (\alpha_j)^i \, i=0,1,\ldots,k_j-1 \qquad (7)$$

In Equation (7), conversion mask ROM 320 comprises $k_j$ conversion masks $d_j(x)$ 322 that each comprise one or more bits.

Again referring to FIG. 3, the converter 330, in a further example, is responsive to one or more instances of conversion mask $d_j(x)$ 322 and representation $c_j(x)$ 342, for computing the syndrome $s_j$ 222 such as by the following exemplary Equation (8).

$$s_j = c_{k-1}d_{k-1} + \ldots + c_1 d_1 + c_0 d_0 = c_{k-1}d_{k-1} + \ldots + c_1 d_1 + c_0 \qquad (8)$$

In Equation (8), the members $c[0], \ldots,$ and $c[k-1]$ of the representation $c_j(x)$ 342 are binary, as a result of using the k-tuple basis with respect to $(\alpha^j)^{k-1}, \ldots, \alpha^j, 1$. Although Equation (8) may appear to require general GF multiplications, advantageously no general $GF(2^m)$ multiplication is necessary. Because the members $c[0], \ldots,$ and $c[k-1]$ are binary, a desirably simple algorithm such as $$z = c_0$$
$$\text{do } i = 1, \ldots, k_j - 1$$
$$z = z \wedge \begin{cases} d_i & \text{if } c_i = 1 \\ 0 & \text{otherwise} \end{cases}$$
$$\text{end do}$$
$$s_j = z$$

can be used by converter 330 for the conversion, where z comprises an adder. Furthermore, a number of other implementations of Equation (8) may be employed, as will be appreciated by those skilled in the art.

Figure 6:
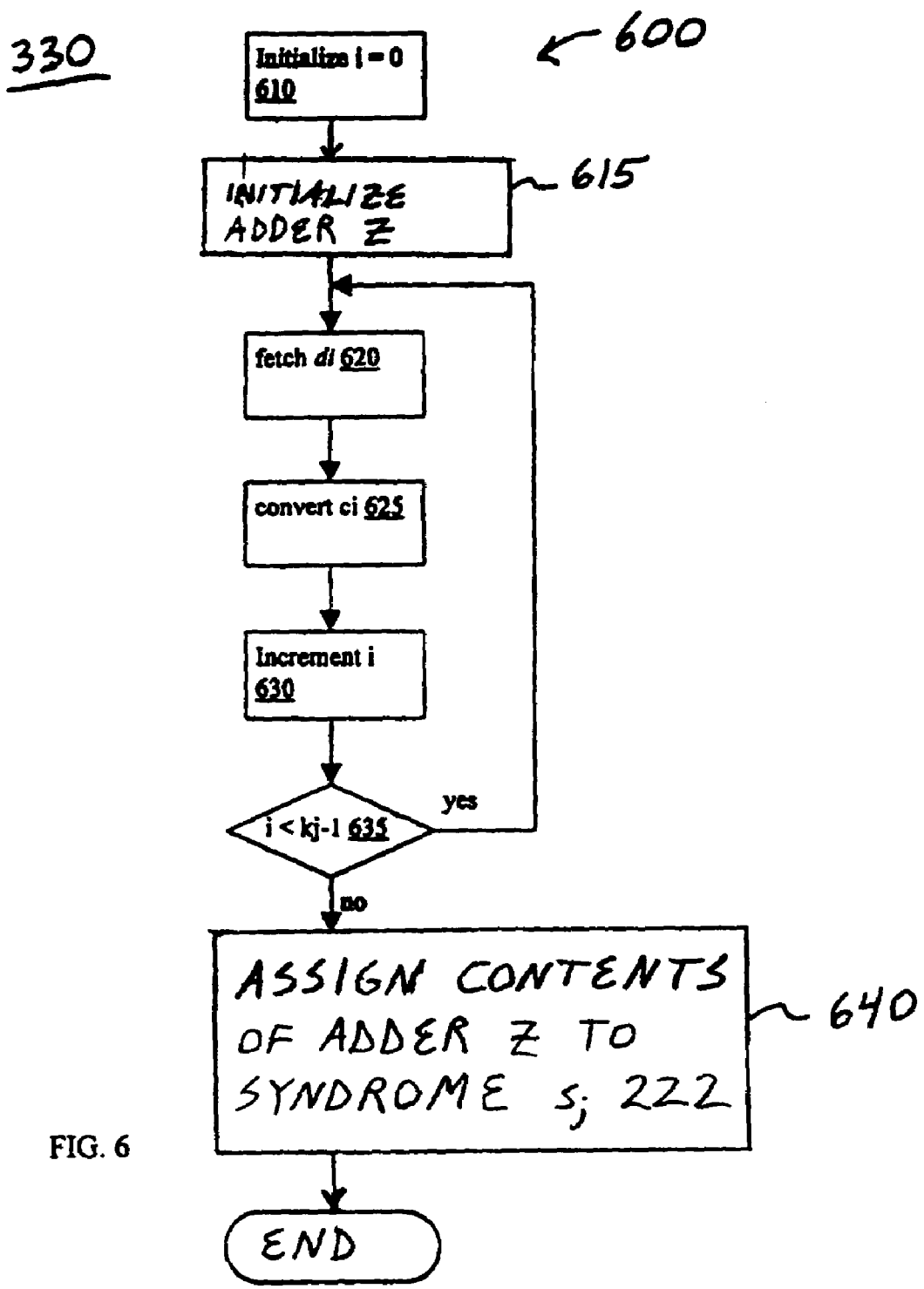
FIG. 6 depicts one example of logic employed by a converter component of the syndrome generator component of FIG. 3.

FIG. 6 represents one example of logic 600 for producing syndromes s 225 (FIG. 2). In one example, converter 330 (FIG. 3) employs (e.g., performs) logic 600. Initialization 610 sets a counter i to 0. Initialization 615 sets adder z to 0. STEP 620 fetches the $i^{th}$ element of one or more instances of conversion mask $d_j(x)$ 322. In STEP 625, the fetched element from STEP 620, is added (in the $GF(2^m)$ sense) to the adder z if the $i^{th}$ element of the representation $c_j(x)$ 342 is 1. STEP 630 increments counter i by 1. DECISION 635 checks to determine whether the counter i (as present before STEP 630) is less than minimal polynomial degree $k_j$ 354. STEP 640 assigns the contents of the adder z (as computed in STEP 625) to the syndrome $s_j$ 222.

Figure 7:
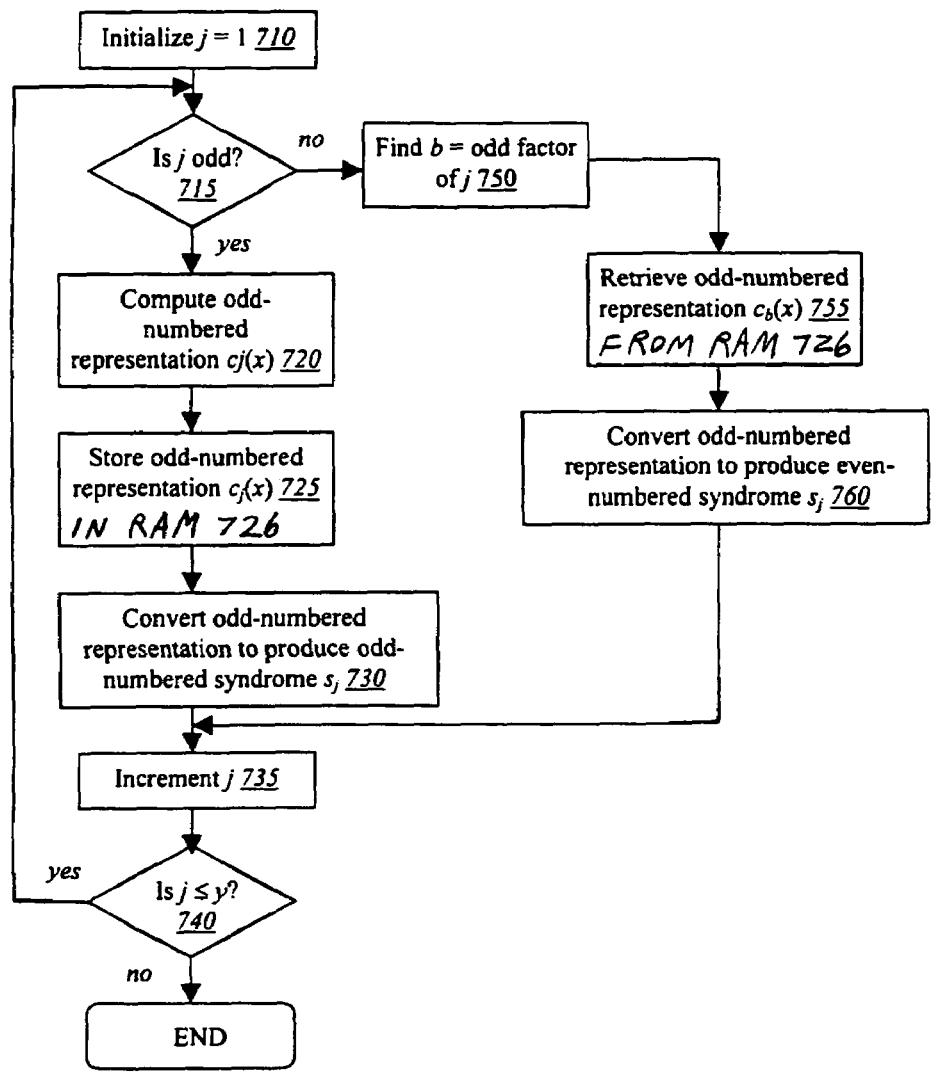
FIG. 7 depicts exemplary logic employed by one example of a syndrome computer component of the decoder component of FIG. 2.

FIG. 7 represents one example of logic 700 for producing syndromes s 225 (FIG. 2). In one example, syndrome computer 240 (FIG. 2) employs (e.g., performs) logic 700. A further example employs a starting power L=0. From Equation (2), a result of setting L=0 is that a syndrome $s_j$ 222 corresponds to a generator polynomial root $\alpha^j$ 212. So, in one example, an odd-numbered syndrome $s_{2j-1}$ 222 corresponds to an odd-powered generator polynomial root $\alpha^{2j-1}$ 212. Further, the odd-numbered syndrome $s_{2j-1}$ 222 has an odd-numbered representation $c_{2j-1}(x)$ 342. Similarly, an even-numbered syndrome $s_{2j}$ 222 corresponds to an even-powered generator polynomial root $\alpha^{2j}$ 212. In addition, the even-numbered syndrome $s_{2j}$ 222 has an even-numbered representation $c_{2j}(x)$ 342.

In one example, any even number e can be expressed as a product of an odd integer b and powers of two, such as by employment of the following exemplary Equation (9).

$$b = e/2^h \qquad (9)$$

In Equation (9), the power h is a non-negative integer.

From Equations (1) and (9), those skilled in the art will appreciate that an even-numbered syndrome $s_e$ 222 can be computed by employing an odd-numbered representation $c_b(x)$ 342 and one or more instances of conversion mask $d_e(x)$ 322, such as by employment of the following exemplary Equation (10).

$$s_e = \sum_{i=0}^{k_j-1} c_i^{(b)} d_i^{(e)} \qquad (10)$$

In Equation (10), $C_i^{(b)}$ comprises the $i^{th}$ member of the odd-numbered representation $c_b(x)$ 342. In addition, $d_i^{(e)}$ comprises the $i^{th}$ member of the one or more instances of conversion mask $d_e(x)$ 322. In one example, $d_i^{(e)}$ of Equation (10) comprises a modified version of Equation (8), as will be understood by those skilled in the art. In one advantageous aspect, Equation (10) provides evaluation of even-numbered syndromes $s_e$ 222 with desirable avoidance of, for example, the exponentiation of Equation (2), as will be appreciated by those skilled in the art.

Now referring to FIG. 7, initialization 710 sets a counter j to 1. DECISION 715 checks to determine whether the counter j is even or odd. In one example, DECISION 715 determines whether the generator polynomial root 212 is even-powered or odd-powered. When DECISION 715 determines that the counter j is odd, STEP 720 processes received vector r(x) 122 using initialization 118 and minimal polynomial $p_j(x)$ 352, to produce an odd-numbered instance of representation $c_j(x)$ 342. Since L=0, in an example, the minimal polynomial $p_j(x)$ 352 corresponds to an odd-powered root of generator polynomial g(x) 114. STEP 725 stores the odd-numbered instance of representation $c_j(x)$ 342, for example, in random access memory ("RAM") 726.

Referring again to FIG. 7, STEP 730, in one example, employs logic 600 (FIG. 6) to produce an odd-numbered instance of syndrome $s_j$ 222 from an odd-numbered instance of representation $c_j(x)$ 342, as will be appreciated by those skilled in the art. STEP 735 increments counter j by 1. DECISION 740 determines whether the counter j (as present after STEP 735) is less than or equal to the number, y, of necessary roots. In one example, y comprises 2t values.

Further referring to FIG. 7, in the event that DECISION 715 determines counter j is even, STEP 750 factors the counter j into an odd number b and powers of two. One example of such factorization can employ Equation (9). STEP 755, in one example, fetches from RAM 726 the odd-numbered instance of representation $c_j(x)$ 342 corresponding to the odd-number b. STEP 760, in one example, employs logic 600 (FIG. 6) to produce an even-numbered instance of syndrome $s_j$ 222 from an odd-numbered instance of representation $c_j(x)$ 342 (determined in STEP 755).

Referring again to FIG. 7, logic 700, in one example, serves to produce syndromes s 225 (FIG. 2) based on sequential processing of the syndromes s 225. In another example, logic 700 first computes instances of odd-numbered representation $c_{2j-1}(x)$ 342. Subsequently, in this example, logic 700 computes syndromes s 225, in any order, from the odd-numbered instances of representation $c_{2j-1}(x)$ 342. In yet another example, logic 700 produces syndromes s 225 by computing syndromes $s_j$ 222 that correspond to an odd-numbered instance of representation $c_b(x)$ 342. With L=0 and t=4, one example of logic 700 can determine (e.g., compute) syndromes $s_1$, $s_2$, $S_4$, and $s_8$ once logic 700 has determined (e.g., computed) an odd-numbered instance of representation $c_1(x)$ 342, since syndromes $s_1$, $s_2$, $s_4$, and $s_8$ correspond to the same odd-numbered instance of representation $c_1(x)$ 342. Similarly, one example of logic 700 can determine syndromes $s_3$ and $s_6$ once logic 700 has determined an odd-numbered instance of representation $c_3(x)$ 342, since syndromes $s_3$ and $s_6$ correspond to the same odd-numbered instance of representation $c_3(x)$ 342, as will be appreciated by those skilled in the art.

The flow diagrams depicted herein are just exemplary. There may be many variations to these diagrams or the steps (or operations) described therein without departing from the spirit of the invention. For instance, the steps may be performed in a differing order, or steps may be added, deleted or modified. All these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for generating a syndrome usable in a decoder, the method comprising the steps of:
    employing information to generate a representation, wherein the step of employing the information to generate the representation comprises the steps of generating a reduction mask from a root of a generator polynomial and employing the reduction mask to generate the representation; and
    generating, with employment of the representation, the syndrome.

2. The method of claim 1 wherein the step of employing the information to generate the representation and the step of generating, with employment of the representation, the syndrome comprise the step of generating a syndrome for a binary Bose-Chaudhuri-Hocquenghem code.

3. The method of claim 1 wherein the step of employing the information to generate the representation and the step of generating, with employment of the representation, the syndrome comprise the step of generating a syndrome for a binary cyclic code.

4. The method of claim 1 wherein the step of generating, with employment of the representation, the syndrome comprises the step of converting and/or transforming the representation to obtain the syndrome.

5. The method of claim 1 wherein the step of employing the information to generate the representation comprises the step of selecting the portion of the vector to comprise a portion of a preprocessed vector.

6. The method of claim 1 wherein the step of employing the reduction mask to generate the representation comprises the step of selecting the reduction mask to represent a minimal polynomial that is based on a cyclotomic coset and on the root of the generator polynomial.

7. The method of claim 1 wherein the representation comprises an odd-numbered representation, wherein the syndrome comprises an odd-numbered syndrome, in combination with a method for generating the odd-numbered syndrome, comprising the steps of:
    employing the reduction mask to generate the odd-numbered representation; and
    generating, with employment of the odd-numbered representation, the odd-numbered syndrome.

8. The method of claim 1 wherein the step of generating, with employment of the representation, the syndrome comprises the steps of:
    determining a conversion mask from a root of a generator polynomial; and
    converting, with employment of the conversion mask, the representation to obtain the syndrome.

9. The method of claim 1 wherein the step of employing the information to generate the representation comprises the step of employing a number of minimal polynomials to operate on the portion of the vector.

10. The method of claim 9 wherein the step of employing the number of minimal polynomials to operate on the portion of the vector comprises the step of selecting the number of minimal polynomials to comprise a generator polynomial employed to encode the portion of the vector.

11. The method of claim 1 wherein the representation comprises an odd-numbered representation, wherein the syndrome comprises an even-numbered syndrome, in combination with a method for generating the even-numbered syndrome, comprising the steps of:
    employing the reduction mask to generate the odd-numbered representation; and
    generating, with employment of the odd-numbered representation, the even-numbered syndrome.

12. The method of claim 11 wherein the root of the generator polynomial comprises an even-powered root of the generator polynomial, and wherein the step of generating, with employment of the odd-numbered representation, the even-numbered syndrome comprises the steps of:
    determining a conversion mask from an even-powered root of the generator polynomial; and
    converting, with employment of the conversion mask, the odd-numbered representation to obtain the even-numbered syndrome.

13. A system for generating a syndrome usable in a decoder, the system comprising:
    a reducer that employs information to generate a representation and wherein the reducer employs a reduction mask to generate the representation, wherein the reduction mask is generated from a root of a generator polynomial; and
    a converter that generates, with employment of the representation, the syndrome.

14. The system of claim 13 wherein the reducer and the converter generate a syndrome for a binary Bose-Chaudhuri-Hocquenghem code.

15. The system of claim 13 wherein the reducer and the converter generate a syndrome for a binary cyclic code.

16. The system of claim 13 wherein the converter converts and/or transforms the representation to obtain the syndrome.

17. The system of claim 13 wherein the reduction mask represents a minimal polynomial that is based on a cyclotomic coset and on the root of the generator polynomial.

18. The system of claim 13 wherein the representation comprises an odd-numbered representation, wherein the syndrome comprises an odd-numbered syndrome, in combination with a system for generating the odd-numbered syndrome, wherein the reducer employs the reduction mask to generate the odd-numbered representation, and wherein the converter generates, with employment of the odd-numbered representation, the odd-numbered syndrome.

19. The system of claim 13 wherein the converter converts, with employment of a conversion mask, the representation to obtain the syndrome, wherein the conversion mask is determined from a root of a generator polynomial.

20. The system of claim 13 wherein the reducer employs a number of minimal polynomials to operate on the portion of the vector.

21. The system of claim 20 wherein the reducer selects the number of minimal polynomials to comprise a generator polynomial employed to encode the portion of the vector.

22. The system of claim 13 wherein the representation comprises an odd-numbered representation, wherein the syndrome comprises an even-numbered syndrome, in combination with a system for generating the even-numbered syndrome, wherein the reducer employs the reduction mask to generate the odd-numbered representation, and wherein the converter generates, with employment of the odd-numbered representation, the even-numbered syndrome.

23. The system of claim 22 wherein the root of the generator polynomial comprises an even-powered root of the generator polynomial, and wherein the converter converts, with employment of a conversion mask, the odd-numbered representation to obtain the even-numbered syndrome, wherein the conversion mask is determined from an even-powered root of the generator polynomial.

24. An article of manufacture, comprising:
at least one computer usable medium having computer readable program code means embodied therein for causing generation of a syndrome usable in a decoder, the computer readable program code means in the article of manufacture comprising:
computer readable program code means for causing a computer to employ information to generate a representation, wherein the computer readable program code means for causing a computer to employ the information to generate the representation comprises computer readable program code means for causing a computer to generate a reduction mask from a root of a generator polynomial and computer readable program code means for causing a computer to employ the reduction mask to generate the representation; and
computer readable program code means for causing a computer to generate, with employment of the representation, the syndrome.

25. The article of manufacture of claim 24 wherein the computer readable program code means for causing a computer to employ the information to generate the representation and the computer readable program code means for causing a computer to generate, with employment of the representation, the syndrome comprise computer readable program code means for causing a computer to generate a syndrome for a binary Bose-Chaudhuri-Hocquenghem code.

26. The article of manufacture of claim 24 wherein the computer readable program code means for causing a computer to employ the information to generate the representation and the computer readable program code means for causing a computer to generate, with employment of the representation, the syndrome comprise computer readable program code means for causing a computer to generate a syndrome for a binary cyclic code.

27. The article of manufacture of claim 24 wherein the computer readable program code means for causing a computer to generate, with employment of the representation, the syndrome comprises computer readable program code means for causing a computer to convert and/or transform the representation to obtain the syndrome.

28. The article of manufacture of claim 24 wherein the computer readable program code means for causing a computer to generate, with employment of the representation, the syndrome comprises:
computer readable program code means for causing a computer to determine a conversion mask from a root of a generator polynomial; and
computer readable program code means for causing a computer to convert, with employment of the conversion mask, the representation to obtain the syndrome.

29. The article of manufacture of claim 24 wherein the computer readable program code means for causing a computer to employ the information to generate the representation comprises:
computer readable program code means for causing a computer to generate a reduction mask from a root of a generator polynomial; and
computer readable program code means for causing a computer to employ the reduction mask to generate the representation.

30. The article of manufacture of claim 29 wherein the computer readable program code means for causing a computer to employ the reduction mask to generate the representation comprises computer readable program code means for causing a computer to select the reduction mask to represent a minimal polynomial that is based on a cyclotomic coset and on the root of the generator polynomial.

31. The article of manufacture of claim 29 wherein the representation comprises an odd-numbered representation, wherein the syndrome comprises an odd-numbered syndrome, wherein the at least one computer usable medium includes second computer readable program code means embodied therein for causing generation of the odd-numbered syndrome, the second computer readable program code means in the article of manufacture comprising:
computer readable program code means for causing a computer to employ the reduction mask to generate the odd-numbered representation; and
computer readable program code means for causing a computer to generate, with employment of the odd-numbered representation, the odd-numbered syndrome.

32. The article of manufacture of claim 29 wherein the representation comprises an odd-numbered representation, wherein the syndrome comprises an even-numbered syndrome, wherein the at least one computer usable medium includes second computer readable program code means embodied therein for causing generation of the even-numbered syndrome, the second computer readable program code means in the article of manufacture comprising:

computer readable program code means for causing a computer to employ the reduction mask to generate the odd-numbered representation; and computer readable program code means for causing a computer to generate, with employment of the odd-numbered representation, the even-numbered syndrome.

33. The article of manufacture of claim 32 wherein the root of the generator polynomial comprises an even-powered root of the generator polynomial, and wherein the computer readable program code means for causing a computer to generate, with employment of the odd-numbered representation, the even-numbered syndrome comprises:

computer readable program code means for causing a computer to determine a conversion mask from an even-powered root of the generator polynomial; and computer readable program code means for causing a computer to convert, with employment of the conversion mask, the odd-numbered representation to obtain the even-numbered syndrome.

* * * * *